United States Patent
He et al.

(10) Patent No.: US 9,570,589 B2
(45) Date of Patent: Feb. 14, 2017

(54) FINFET SEMICONDUCTOR DEVICE AND FABRICATION METHOD

(71) Applicant: Semiconductor Manufacturing International (Shanghai) Corporation, Shanghai (CN)

(72) Inventors: Yonggen He, Shanghai (CN); Bing Wu, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/959,008

(22) Filed: Dec. 4, 2015

(65) Prior Publication Data

US 2016/0163833 A1    Jun. 9, 2016

(30) Foreign Application Priority Data

Dec. 4, 2014  (CN) .......................... 2014 1 0734651

(51) Int. Cl.

| H01L 29/66 | (2006.01) |
|---|---|
| H01L 29/78 | (2006.01) |
| H01L 21/02 | (2006.01) |
| H01L 29/165 | (2006.01) |

(52) U.S. Cl.
CPC ..... *H01L 29/66795* (2013.01); *H01L 21/0217* (2013.01); *H01L 21/02247* (2013.01); *H01L 29/785* (2013.01); *H01L 29/7848* (2013.01); *H01L 29/165* (2013.01)

(58) Field of Classification Search
CPC .................... H01L 29/66795; H01L 21/02247; H01L 29/785; H01L 21/0217; H01L 29/7843

See application file for complete search history.

(56) References Cited

U.S. PATENT DOCUMENTS

| 6,960,509 | B1* | 11/2005 | Han | ................. | H01L 29/66818 |
|---|---|---|---|---|---|
| | | | | | 257/E21.285 |
| 7,151,018 | B1* | 12/2006 | Nunan | ............. | H01L 21/28052 |
| | | | | | 257/E21.199 |
| 7,560,344 | B2* | 7/2009 | Kim | ................. | H01L 21/28273 |
| | | | | | 257/276 |
| 9,324,830 | B2* | 4/2016 | He | ...................... | H01L 29/7851 |
| 2005/0186742 | A1* | 8/2005 | Oh | .................... | H01L 29/66818 |
| | | | | | 438/283 |
| 2014/0332861 | A1* | 11/2014 | Cheng | ............ | H01L 29/66795 |
| | | | | | 257/288 |
| 2015/0008490 | A1* | 1/2015 | Strain | .............. | H01L 29/66795 |
| | | | | | 257/288 |

(Continued)

*Primary Examiner* — William Coleman
(74) *Attorney, Agent, or Firm* — Anova Law Group, PLLC (57) ABSTRACT

FinFET semiconductor devices and fabrication methods are provided. Discrete fins are formed on a substrate. An insulation layer is formed on the substrate between the discrete fins, the insulation layer having a top surface lower than a top surface of the fin and covering a portion of a sidewall surface of the fin. A sidewall spacer is formed covering the sidewall surface of the fin and exposing the top surface of the fin. A top portion of the fin is selectively nitrided to convert a thickness portion of the fin into a semiconductor nitride layer on a remainder fin. The semiconductor nitride layer is removed to form an opening on the remainder fin and between adjacent sidewall spacers. A stress layer is formed to fill the opening.

20 Claims, 6 Drawing Sheets

(56) References Cited

U.S. PATENT DOCUMENTS

2015/0145064 A1* 5/2015 Ramachandran ..... H01L 29/785
257/401
2016/0035891 A1* 2/2016 Xu ..................... H01L 29/7843
257/288

* cited by examiner

FINFET SEMICONDUCTOR DEVICE AND FABRICATION METHOD

CROSS-REFERENCES TO RELATED APPLICATIONS

This application claims priority to Chinese Patent Application No. CN201410734651.3, filed on Dec. 4, 2014, the entire content of which is incorporated herein by reference.

FIELD OF THE DISCLOSURE

The present disclosure relates to the field of semiconductor manufacturing technology and, more particularly, relates to fin field effect transistor (FinFET) semiconductor devices and methods for forming the same.

BACKGROUND

With continuous development of semiconductor technology, semiconductor technology nodes continue to decrease based on Moore's Law. In order to adapt to the reduced technology nodes, channel length of MOSFET devices is shortened. The shortened channel length may allow increases of die density and increases of switching speed of the MOSFET.

However, as the channel length of the device is shortened, the distance between the source and the drain of the device may also be shortened. This increases difficulties for the gate to control the channel region and increases difficulties in gate voltage to pinch off the channel. Then, subthreshold leakage phenomenon, i.e., the so-called short-channel effects, may be more likely to occur.

In order to better adapt to the scaled-down device dimensions, focuses of semiconductor technology are gradually changed from planar MOSFET transistors to three-dimensional-type transistors, such as fin field effect transistor (FinFET), with high efficacy. In a FinFET device, the gate may control the fin at least from both sides of the ultra-thin body (the fin) and may have much stronger control capability on the channel region, as compared with planar MOSFET devices. The short channel effects may be suppressed. Further, the FinFET may have better compatibility with existing IC production technology.

According to carrier mobility enhancement technology, the improved carrier mobility in the channel region may increase drive current of the FinFET device. Performance of FinFET may be improved.

In conventional semiconductor fabrication process, because a stress layer may be used to exert stress in the channel region to alter energy gap and carrier mobility of the silicon material. Performance of FinFET devices may then be improved. In particular, by appropriately controlling the stress in the devices, carrier (e.g., electrons for NMOS FinFET and holes for PMOS FinFET) mobility can be increased to improve drive current to greatly improve the performance of the FinFET devices.

However, the stress layer formed using conventional methods may result in undesirable electrical performance of the resultant FinFET devices.

BRIEF SUMMARY OF THE DISCLOSURE

According to various embodiments, there is provided a method for forming FinFET. In the method, discrete fins are formed on a substrate. An insulation layer is formed on the substrate between the discrete fins, the insulation layer having a top surface lower than a top surface of the fin and covering a portion of a sidewall surface of the fin. A sidewall spacer is formed covering the sidewall surface of the fin and exposing the top surface of the fin. A top portion of the fin is selectively nitrided to convert a thickness portion of the fin into a nitrided layer on a remainder fin. The nitrided layer is removed to form an opening on the remainder fin and between adjacent sidewall spacers. A stress layer is formed to fill the opening.

According to various embodiments, there is also provided a semiconductor device. The semiconductor device includes discrete fins on a substrate. An insulation layer is on the substrate between the discrete fins, the insulation layer having a top surface lower than a top surface of the fin and covering a portion of a sidewall surface of the fin. A sidewall spacer covers the sidewall surface of the fin and has a top surface higher than the top surface of the fin. A stress layer is on the top surface of the fin and between the sidewall spacers. The stress layer is formed by: selectively nitriding a top portion of the fin to convert a thickness portion of the fin into a nitrided layer on a remainder fin, removing the nitrided layer to form an opening on the remainder fin and between adjacent sidewall spacers; and forming a stress layer to fill the opening.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
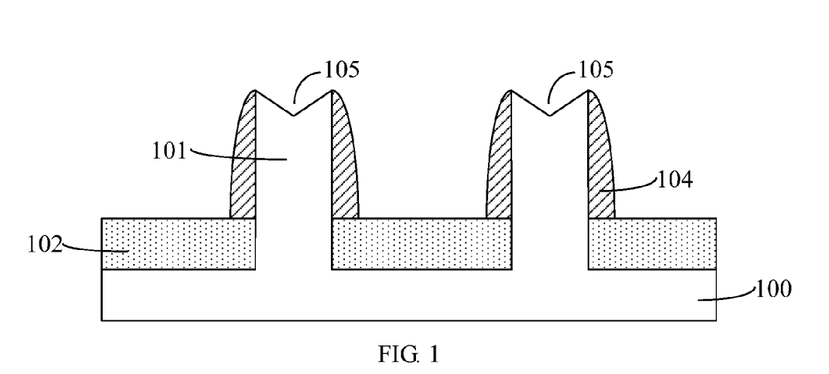
FIGS. 1-2 illustrate cross-sectional views of exemplary semiconductor structures for forming a FinFET consistent with various disclosed embodiments of present disclosure.
Figure 2:
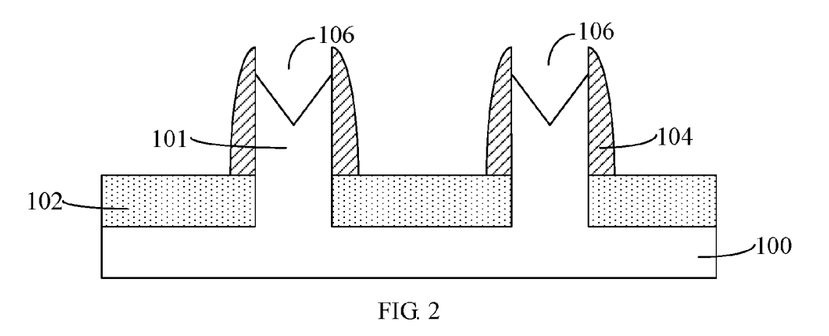

FIGS. 1-2 illustrate cross-sectional views of exemplary semiconductor structures for forming a FinFET consistent with various disclosed embodiments of present disclosure.

Referring to FIG. 1, in one embodiment, fins 101 are provided on a substrate 100. An insulation layer 102 is formed on surface of the substrate 100 and between adjacent fins 101. The insulation layer 102 may cover a portion of the sidewall surface of the fin 101 and may have a top surface lower than a top surface of the fin 101.

A barrier layer is formed on the top surface of the insulation layer 102 and on sidewall and top surfaces of the fin 101. The barrier layer is then processed using a mask-less etching process to remove a portion that is on each of the top surface of the fin 101 and the insulation layer 102, to form the sidewall spacer 104. As shown in FIG. 1, the sidewall spacer 104 may be on sidewall surface of the fin 101 and may expose the top surface of the fin 101.

It is important to form the sidewall spacer 104. Without forming the sidewall spacer 104, in the subsequent processes, an epitaxial layer may be directly formed on the sidewall and top surfaces of the fin 101, which may cause reduced spacing between adjacent fins and thus to bridge adjacent fins 101. In addition, such bridging may increase difficulties in subsequent processes for filling dielectric/insulating material between adjacent fins 101, resulting in voids, bubbles, and/or holes formed in the resultant interlayer dielectric layer. To avoid such problems, a stress layer may be epitaxially formed only on the top surface of the fin 101. Thus, there is a need to form the sidewall spacer 104 to cover the sidewall surface of the fin 101, such that the stress layer may not be epitaxially formed on the sidewall surface of the fin 101.

However, in actual fabrication process, when the sidewall spacer 104 has been formed on the sidewall surface of the fin 101, a V-shaped groove 105 may be formed into the top surface of the fin 101.

The V-shaped groove 105 may be formed, when removing the barrier layer from the top surface of the fin 101, to expose the top surface of the fin 101. An over-etching may occur on the top surface of the fin 101 due to difficulties in accurately controlling the etching-stop position. Because the sidewall spacer 104 is on the sidewall surface of the fin 101, etching gas to etch the fin 101 may be blocked and/or hit back by the sidewall spacer 104. The etch rate may gradually decrease along a direction from the central region to the sidewall spacer 104 to form the V-shaped groove 105 in the top surface of the fin 101.

Referring to FIG. 2, a thickness portion of the fin 101 is etched away and removed using a dry etching process. A stress layer may then be formed on the top surface of remainder fin 101.

After etching to remove the thickness portion of the fin 101, a deep V-shaped groove 106 may be formed into the top surface of the fin 101. The V-shaped deep groove 106 may be larger (in dimensions) than the V-shaped groove 105 in FIG. 1. The V-shaped deep groove 106 may seriously affect quality of the subsequently formed the stress layer with undesirable quality.

When partially removing a thickness of the fin 101 between adjacent sidewall spacer 104, another over-etching may occur to the fin 101 due to presence of the sidewall spacer 104, blocking the etching gas and having the etch rate gradually decrease along a direction from the central region to the sidewall spacer 104. On the other hand, the V-shaped deep groove 106 may be formed from the V-shaped groove 105 in the top surface of the fin 101. As such, after removing a thickness portion of the fin 101, the V-shaped deep groove 106 in FIG. 2 may be formed with larger sizes over the V-shaped groove 105 in FIG. 1.

In other words, even the top surface of the fin 101 is flat after forming the sidewall spacer 104, when dry etching to remove the thickness portion of the fin 101, due to presence of the sidewall spacer 104, the etching rate in the central region of the top surface of the fin 101 may be greater than the etch rate near the sidewall spacer 104. Thus, after the removal of thickness portion of the fin 101, the V-shaped deep groove 106 may be formed in the remainder fin 101.

The present disclosure provides a method of forming a FinFET. After forming a sidewall spacer to cover on the sidewall surface of a fin and to expose a top surface of the fin, the top surface of the fin is selectively nitrided to covert a thickness portion of the fin into a nitrided layer. An etching process such as a wet etching process is used to remove the nitride semiconductor layer to form an opening between adjacent sidewall spacers and on the remainder fin. The opening is filled with the stress layer. In one embodiment, the wet etching process may provide a high etch selectivity to completely etch and remove the nitrided layer with no over-etching occurring to damage a top surface of the remainder fin to provide a flat and/or planar top surface to the remainder fin. In this case, even assuming that the top surface to the remainder fin is wet etched with a certain etch rate, the etch rate in the wet etching process may not be affected by the sidewall spacer. The resultant remainder fin may still have a substantially flat and/or planar top surface to provide desirable surface topography at the bottom of the opening. Quality of the subsequently formed stress layer may be provided to form a FinFET with improved performance.

FIGS. 3-15 illustrate cross-sectional views of exemplary FinFET semiconductor structures at various stages during its formation consistent with various disclosed embodiments.

Figure 3:
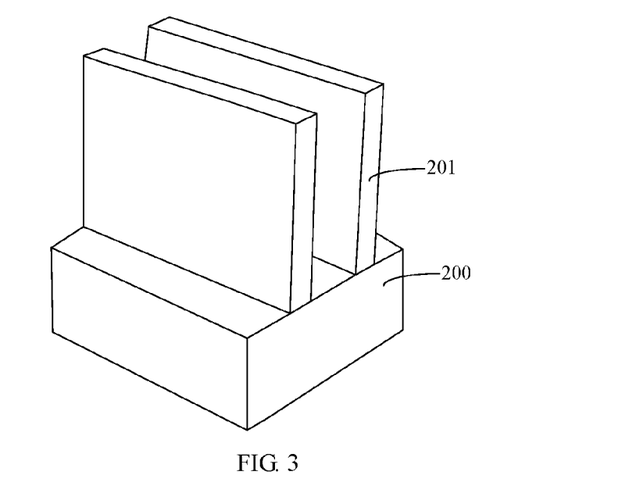
FIGS. 3-15 illustrate cross-sectional views of exemplary FinFET semiconductor structures at various stages during its formation consistent with various disclosed embodiments of present disclosure.

Referring to FIG. 3, a substrate 200 is provided. Discrete fins 201 are formed on surface of the substrate 200.

In various embodiments, the substrate 200 may be a silicon or silicon-on-insulator (SOI). The substrate 200 may also be germanium, silicon germanium, gallium arsenide, and/or germanium-on-insulator. In one embodiment, the substrate 200 is made of silicon. When a bulk silicon is used as the substrate 200, fabrication cost of forming the FinFET can be reduced, and the fabrication process can be compatible with the production process of an existing planar transistor.

A P-well or N-well may be formed in the substrate 200. For example, when the to-be-formed FinFET is an NMOS device, a P-well is formed within the substrate 200. When the to-be-formed FinFET is a PMOS device, an N-well may be formed in the substrate 200. In addition, the substrate 200 may be implanted to adjust threshold voltage of the subsequently formed FinFET. In addition, the substrate 200 may be annealed to activate dopant ions within the substrate 200.

The fin 201 may be formed by a material including single crystalline silicon or silicon nanowires. In one embodiment, the fin 201 may be formed by dry etching an initial substrate to form protruded portion of the substrate material used as the fin 201 on surface of the remaining of the substrate 200 as shown in FIG. 3.

In another embodiment, the fin may be formed by first forming a semiconductor epitaxial layer on the substrate surface, followed by etching the semiconductor epitaxial layer to form fins on the substrate. The semiconductor epitaxial layer may be a single crystal silicon layer.

In some embodiments, the fin 201 is formed by the following exemplary steps including, e.g., providing an initial substrate and forming a patterned mask layer on the initial substrate surface. The patterned mask layer may define positions for the fins 201 to be subsequently formed. The patterned mask layer may be used as an etch mask to etch away a thickness portion of the substrate 200, e.g., using a reactive ion etching (RIE) process, to form discrete fins on the substrate 200 as shown in FIG. 3.

In other embodiments, the fins may be formed using a double patterning method. For example, the fins may be formed using an initial substrate. A patterned sacrificial layer may be formed on surface of the initial substrate. An initial sidewall layer may be formed on the sacrificial layer and on the initial substrate. The initial sidewall layer may be etched back to form initial sidewall spacer on the sidewall of sacrificial layer. The sacrificial layer may be removed. The initial sidewall spacer may be used as a mask to etch and remove a thickness portion of the initial substrate to form discrete fins on the substrate.

For illustration purposes, the present disclosure is described by forming two fins 201 on surface of the substrate 200 as an example. Of course, various embodiments of present disclosure may encompass less than two or more than two discrete fins formed on substrate surface.

Figure 4:
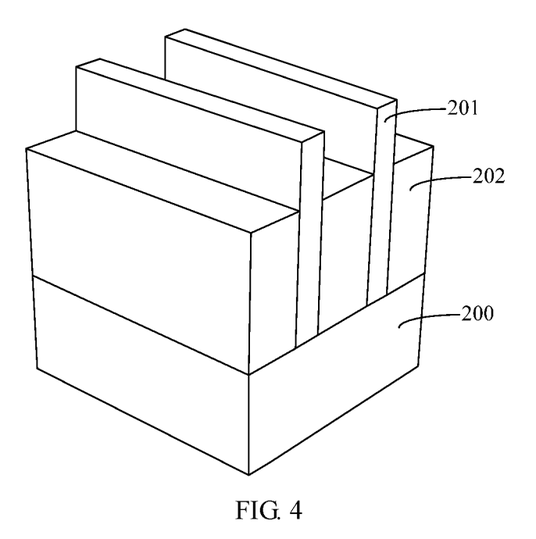

Referring to FIG. 4, an insulation layer 202 is formed on surface of the substrate 200. The insulation layer 202 has a top surface lower than the top surface of the fins 201. The insulation layer 202 may cover a partial sidewall surface of the fin 201.

The insulation layer 202 may be made of silicon oxide, silicon nitride, silicon oxycarbide, and/or any suitable insulating, dielectric material. The insulation layer 202 may be used as isolation structures between adjacent fins 201, and may be used as isolation structures between subsequently formed gate structure and the substrate 200.

The insulation layer 202 may be formed by first depositing an insulating material on the substrate 200 to cover the fins 201 and to fill up openings between adjacent fins 201. A chemical mechanical polishing (CMP) process may be performed to planarize the insulating material. The CMP process may stop at the top surface of the fins 201 such that the insulating material has a polished surface coplanar with the top surface of the fins 201. The insulating material may then be etched back to form the insulation layer 202 having a top surface lower than the top surface of the fins 201.

Figure 5:
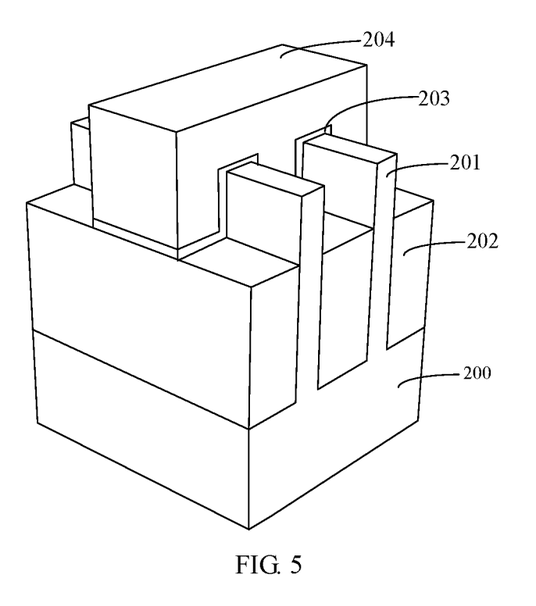

Referring to FIG. 5, a gate structure is formed on the insulation layer 202 and across a length portion of at least one fin 201. The gate structure may cover a portion of the top and/or sidewall surfaces of the fin 201.

The gate structure may include a gate dielectric layer 203 and a gate electrode 204 formed on the gate dielectric layer 203.

In one embodiment, the gate structure may include a metal gate structure or any other suitable gate structures. The gate dielectric layer 203 may be formed of a material including a high-K dielectric material, such as, for example, hafnium oxide, zirconium oxide, aluminum oxide, silicon oxide, zirconium oxide, hafnium silicon oxide, and/or any suitable dielectric materials. The high-K dielectric material may include a material having a relative dielectric constant greater than silicon oxide. The gate electrode 204 may be formed of a material including aluminum, tungsten, titanium, titanium nitride, tantalum, tantalum carbide, and/or other suitable gate metallic material. The gate structure may be the gate structure of the finally formed FinFET.

In other embodiments, the gate structure may be a polysilicon gate structure having a gate dielectric layer made of silicon oxide and a gate electrode made of polysilicon or doped polysilicon.

The gate structure may also be a dummy gate structure. The dummy gate structure may include a gate dielectric layer and a dummy gate electrode on the gate dielectric layer. The gate dielectric layers used in the gate structure and the dummy gate structure may be the same or different. In one example, the gate dielectric layer is made of silicon oxide, and the dummy gate electrode is made of polysilicon. Subsequently, a gate-last process may be performed to remove the dummy gate structure and to form, e.g., a metal gate structure.

In one embodiment, the gate structure may be formed across two fins 201, thereby increasing the area of the channel region under the gate structure. In other embodiments, the gate structure may be formed across less than or more than two fins as desired.

In an embodiment, the gate structure may be formed by first forming a gate dielectric material layer on the surface of the insulation layer 202 and on the top surface and sidewall surface of fins 201. A gate electrode material may be formed on the gate dielectric material layer. A patterned mask layer may be formed on surface of the gate electrode material layer and may be used as a mask to pattern the gate electrode material layer and a gate dielectric material layer for form the gate structure across a portion of the fin(s) 201. The patterned mask layer is then removed.

Figure 6:
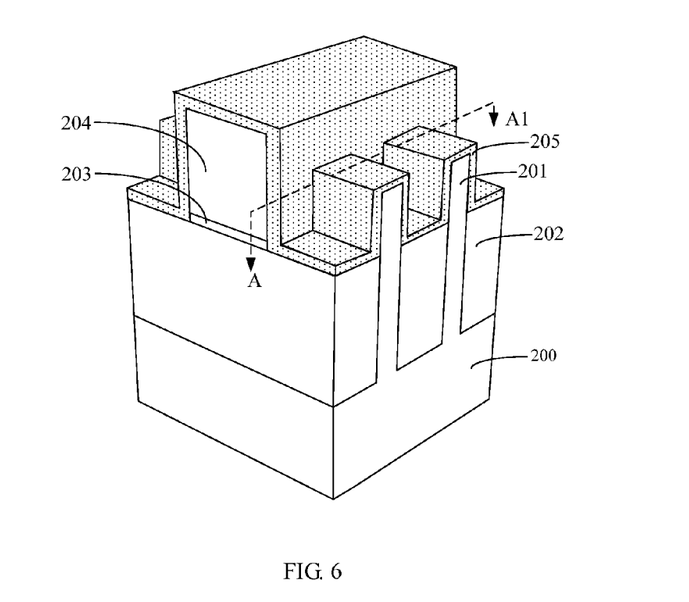
Figure 7:
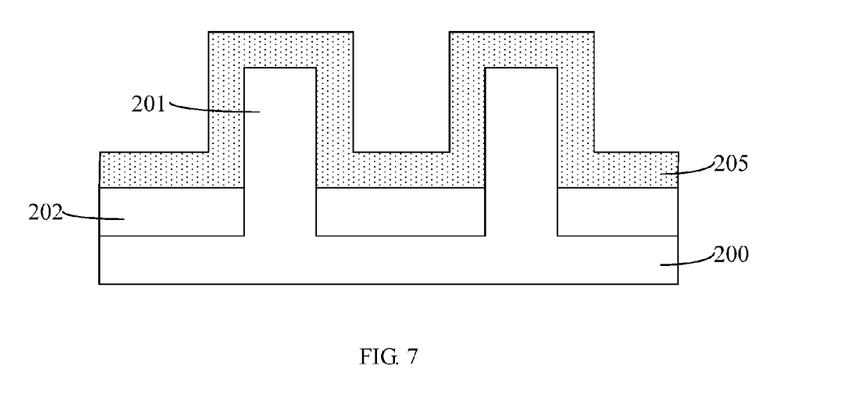

FIG. 7 is a schematic cross-sectional view along A-A1 direction of the structure shown in FIG. 6. As shown, a sidewall layer 205 is formed to cover the insulation layer 202 and to cover the top surface and sidewall surface of the fin 201. The sidewall layer 205 also covers the top surface and sidewall of the gate structure.

The sidewall layer 205 may provide a basis for subsequently forming sidewall spacer on the sidewall surface of fin 201. The formed sidewall spacer may cover the sidewall surface of the fin 201, thereby preventing formation of stress layer on sidewall surface of fins 201 when subsequently forming the stress layer, and avoiding bridging between stress layers.

Subsequently, a nitrided layer may be formed by nitriding a top portion of the fin 201, and then may be etched away by a wet etching process. To avoid the sidewall spacer located on sidewall surfaces of the fin 201 being etched in the wet etching process and to avoid exposing the sidewall surface of fins 201, the wet etching process is selected and controlled to provide a high etching selectivity between the sidewall spacer and the nitrided layer. The sidewall layer 205 may be formed of a material different from the nitrided layer.

In one embodiment, the sidewall layer 205 may be made of silicon oxide or silicon oxynitride. The sidewall layer 205 may include a single layer structure or a stacked structure stacked by multiple layers. The sidewall layer 205 may be made using a chemical vapor deposition, a physical vapor deposition, or an atomic layer deposition process.

In one embodiment, the sidewall layer 205 is made of silicon oxide and formed using a chemical vapor deposition process.

As the size of the semiconductor structure increasingly shrinks, the spacing between adjacent fins 201 may be smaller and smaller. Difficulties in filling sidewall layer 205 may be increased. When the sidewall layer 205 is too thick, top portions of adjacent fins 201 may be easily connected together, affecting quality of the sidewall layer 205. When the sidewall layer 205 is too thin, the subsequently formed sidewall spacer may also be too thin, which may cause partial exposure of sidewall surface of the fins 201 without sufficiently protecting the sidewalls of the fins 201. Thus, the sidewall layer 205 may have a thickness ranging from about 20 Å to about 200 Å.

Figure 8:
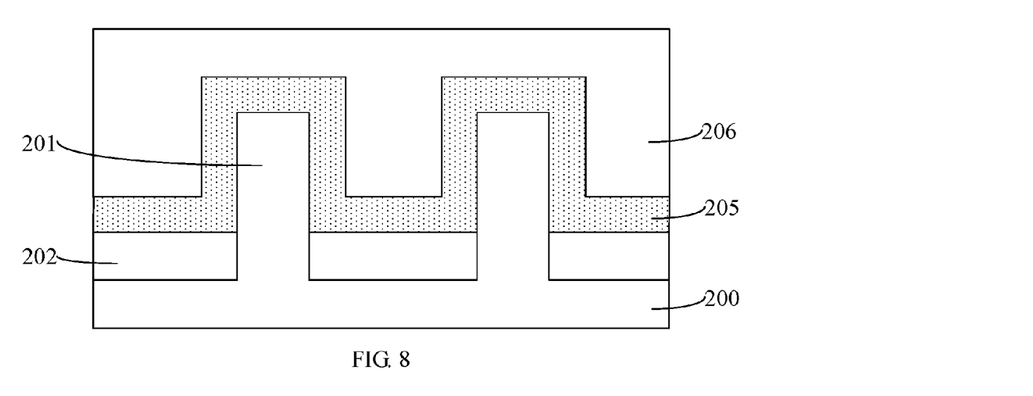

Referring to FIG. 8, an organic material film 206 is formed on the sidewall layer 205. The organic material film 206 has a top surface higher than sidewall layer 205.

The organic material film 206 may fill the area between adjacent fins 201 to prepare for the subsequent chemical mechanical polishing (CMP) process. The subsequent CMP process on the organic material film 206 and sidewall layer 205 may remove a portion of the organic material film 206 and sidewall layer 205 that are above the top surface of the fins 201 to expose the top surface of the fins 201 to form the sidewall spacer (215, see FIG. 9) covering the sidewall surfaces of the fins 201 and covering the surface of the insulation layer 202.

A subsequent removal of the organic material film 206 may be performed to expose the sidewall spacer. Such removal may require low or zero etch rate to the the sidewall spacer.

In one embodiment, the organic material film 206 may be made of an organic anti-reflective material having an organic anti-reflective material either at a bottom or a top thereof. The organic material film 206 may be formed using a spin coating process.

Figure 9:
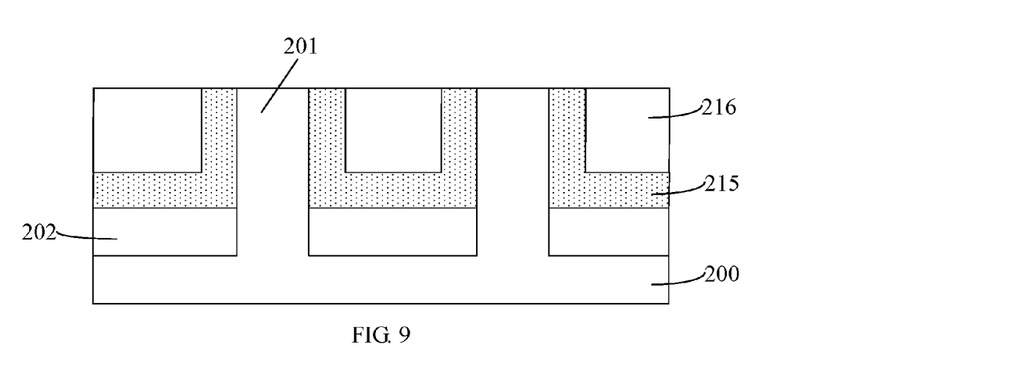

Referring to FIG. 9, a portion of the sidewall layer 205 and the organic material film 206 (refer to FIG. 8) that are on top of the fins 201 is removed to form a sidewall spacer 215 covering the sidewall surface of the fins 201 and covering the top surface of the insulation layer 202, and to form an organic material layer 216 on surface of the sidewall spacer 215.

For example, a CMP process may be performed to remove the portion of the sidewall layer 205 and the organic material film 206 that are on top of the fins 201, until the top surface of the fins 201 are exposed.

By using CMP process to form the organic material layer 216 and the sidewall spacer 215 as shown in FIG. 9, the previously described v-shaped groove shown in FIGS. 1-2 formed by a dry etching may not be formed on the top surface of the fins 201. The top surface of the fins 201 may be flat without forming any grooves. In addition, even the CMP process may remove a thickness portion from the fins 201, the top surface of the fins 201 after the CMP process may still be flat without any grooves.

Figure 10:
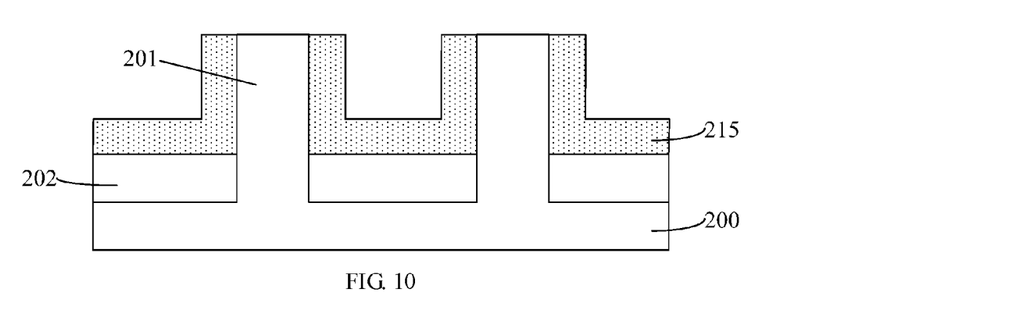

Referring to FIG. 10, the organic material layer 216 shown in FIG. 9 is removed to expose the surface of the sidewall spacer 215.

In one particular embodiment, an ashing process may be used to remove the organic material layer 216.

As such, the sidewall spacer 215 may be formed on both sidewall surfaces of the fins 201, and also covering a surface of the insulation layer 202. The sidewall spacer 215 may thus protect sidewalls of the fins 201, and may also protect the insulation layer 202 during subsequent selective nitriding process. The isolation structure may thus provide desired insulation/isolation properties. Further, the sidewall spacer 215 on the insulation layer 202 may prevent damages to the insulation layer 202 when removing the organic material layer 216.

Figure 11:
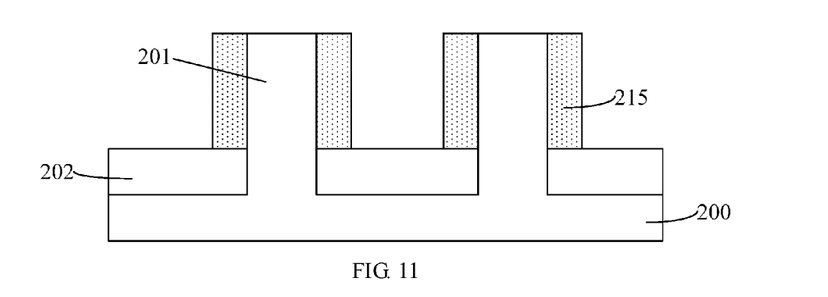

In other embodiments, as shown in FIG. 11, the sidewall spacer 215 may be formed on sidewall surfaces of the fins 201 and a surface portion of the insulation layer 202. For example, the sidewall spacer 215 may be formed by first forming a sidewall layer on the insulation layer 202, and on the top and sidewall surfaces of the fins 201. Using a maskless etching process to etch back the sidewall layer to remove a portion that is on the top surface of the fin 201 and on a surface portion of the insulation layer 202, the sidewall spacer 215 covering the sidewall surfaces of the fins 201 and covering a surface portion of the insulation layer 202 may be formed.

When using an etch-back process to form the sidewall spacer covering sidewall surfaces of the fins 201, V-shaped groove may be possibly formed in the top surface of the fin 201 due to an over-etching. However, the size of such V-shaped groove formed by an etch-back process may be almost negligible. In addition, the subsequent process steps including selectively nitriding a thickness portion of the fin to form a nitrided layer, and removing the nitrided layer may not increase the size of the V-shaped groove in the fin. In some cases, after going through these processes, the top surface the remainder fin may be smoother.

Figure 12:
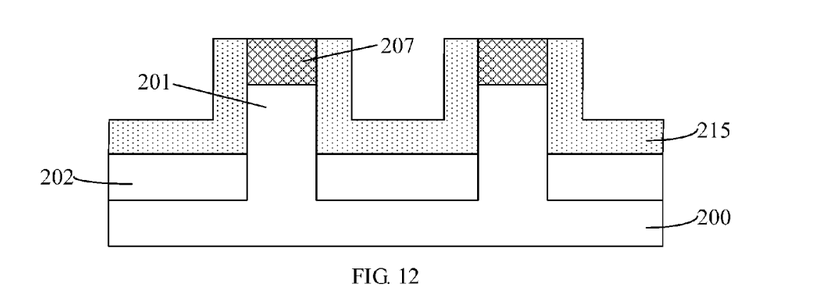

Referring to FIG. 12, a top surface of the fin 201 is selectively nitrided to convert a thickness portion of the fin 201 into a nitride layer, which is also referred to as a semiconductor nitride layer 207.

When performing the selective nitriding process, the insulation layer 202 may remain unchanged. In one embodiment, when the fin 201 is made of silicon, the insulation layer 202 is made of silicon oxide, and the sidewall spacer 215 is made of silicon oxide or oxynitride silicon, and the semiconductor nitride layer 207 is made of silicon nitride.

A same degree of the selective nitriding process may be provided on an entire area of the top surface of each fin 201, the formed semiconductor nitride layer 207 may thus have a uniform thickness. The remainder fin 201 may have a flat top surface after removal of the semiconductor nitride layer 207.

In the selective nitriding process, nitrogen-containing plasma may be used. Specifically, plasma may be formed from a nitrogen-containing gas by plasmaization. The nitrogen-containing gas may include a combination of $N_2$ and Ar, a combination of $N_2$ and He, or $N_2$.

During the selective nitriding process, a nitriding rate of the fin material may be greater than the nitriding rate of the material used to form the insulation layer 202. In various embodiments, materials used for forming the fin and the insulation layer may be selected, such that the fin is selectively nitrided having a nitriding rate greater than a nitriding rate of the insulation layer.

In one embodiment, the selective nitriding process may selectively nitride the fins 201 without nitriding the sidewall spacer 215 and the insulation layer 202. Under certain conditions, binding capability between oxygen atoms and silicon atoms is greater than the binding capability between nitrogen atoms and silicon atoms, and the silicon-oxygen bond is therefore more stable than the silicon-nitrogen bond. When the sidewall spacer 215 and/or the insulation layer 202 are made of silicon oxide or silicon oxynitride, the sidewall spacer 215 and/or the insulation layer 202 may be more stable without being nitrided, while the selective nitriding process may be performed to only nitride the fin 201 made of silicon, for example.

Further, the insulation layer 202 may contain a large number of Si—O bonds having Si—O bond energy of about 4.7 ev, and the fin 201 may contain a large number of Si—Si bonds having Si—Si bond energy of about 2.3 ev. The bond cleavage energy required for the Si—O bond and Si—Si bond are different. By controlling energy of the nitrogen-containing plasma provided in the selective nitriding process, it is possible to selective a plasma energy to only break the Si—Si bond, while the Si—O bond remains unchanged for the selective nitriding process. The selective nitriding process may thus only selectively nitride the fins 201, but not the insulation layer 202.

Further, the fins 201 may also contain Si—H bonds having Si—H bond energy of about 3.3 ev. The Si—H bond may be selectively broken to form Si—N bond and N—H bond, while the Si—O bond remains unchanged during the selective nitriding process.

When changing a pressure in a chamber for the selective nitriding process, the degree for nitriding may be altered in selective nitriding the Si—Si bond and Si—O bond. When the pressure in the chamber for the selective nitriding process is about 0.1 Torr to about 20 Torr, the ability to selectively nitride Si—Si bond is significantly greater than the Si—O bond, and the ability to selectively nitride the top portion of the fins 201 increases and the ability to selectively nitride the insulation layer 202 and/or the sidewall spacer 215 decreases.

In a specific embodiment, when the pressure in the chamber for the selective nitriding process is about 1 Torr to about 10 Torr, the ability to selectively nitride Si—O bonds is close to zero, thereby preventing the selective nitriding the insulation layer 202 and/or sidewall spacer 215. This may also avoid etching of the insulation layer 202 and the sidewall spacer 215 during the subsequent removal of the semiconductor nitride layer 207.

In one embodiment, the nitrogen-containing plasma may be formed using a microwave method or an inductive coupling method (e.g., including ICP, inductive coupled high frequency plasma).

The nitrogen-containing plasma may provide an energy greater than the bond energy of Si—Si bonds and less than bond energy of the Si—O bonds to break the Si—Si bonds and then to form Si—N bond, with the Si—O bond remaining unchanged. Alternatively, the nitrogen-containing plasma may provide energy greater than the energy provided by Si—H bond and less than the energy provided by Si—O bond. In this case, in addition to nitriding the Si—Si bonds in the fins 201, the Si—H bond in the fins 201 may also be nitrided. The degree of nitriding may be increased in the thickness portion of the fin 201 to form the semiconductor nitride layer 207 having a higher content of nitrogen atoms. This may facilitate subsequent removal of the semiconductor nitride layer 207 by a wet etching specifically to nitride materials.

In one embodiment, when the microwave method is used in the selective nitriding process, the reaction gas may be $N_2$ having a $N_2$ flow of about 50 sccm to about 500 sccm at a chamber temperature of about 300° C. to about 500° C. and under a chamber pressure of about 1 Torr to about 10 Torr, and using a source power of 0 watts to about 1,000 watts. By controlling the process parameters, the semiconductor nitride layer 207 may be formed with uniform thickness.

In a specific embodiment, the selective nitriding process may be performed for a time length of about 5 seconds to about 300 seconds.

Figure 13:
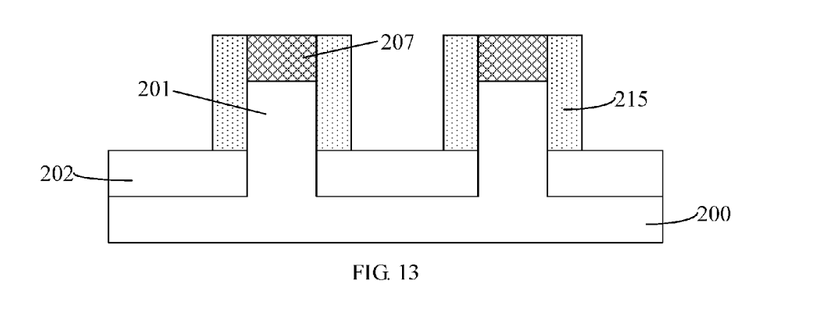

In other embodiments, as shown in FIG. 13, the sidewall spacer 215 may be formed by an etch back process such that the sidewall spacer 215 is located only on sidewall surface of the fins 201 and on surface portions of the insulation layer 202. Other surface portions of the insulation layer 202 may be exposed to the selective nitriding process. Even in this case, the selective nitriding process may not nitride the exposed portion of the insulation layer 202. The insulation layer 202 remains unchanged. This may be because the insulation layer 202 is made of a silicon oxide material, and in certain circumstances, the bond between silicon and oxygen atoms are greater than the bond between silicon and nitrogen atoms to allow the silicon-oxygen bond to be more stable than the silicon-nitrogen bond. Therefore it is difficult to nitride the insulation layer 202 in the selective nitriding process to prevent etching of the insulation layer 202 during subsequent wet etching process to remove the semiconductor nitride layer 207.

Figure 14:
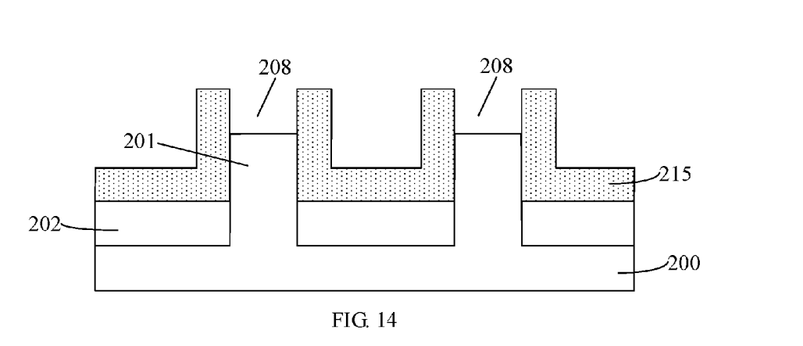

Referring to FIG. 14, a wet etching process may be used to remove the semiconductor nitride layer 207 to form openings 208 on the remainder fin 201 and between adjacent sidewall spacers 215.

The wet etching process may etch the semiconductor nitride layer 207 with a desired etch rate, while the sidewall spacer 215 and insulation layer 202 may not be etched or may have substantially no etch rate.

In one embodiment, the wet etching process uses an etching liquid containing phosphoric acid-based solution with a temperature of about 120° C. to about 180° C. The wet etching process may be performed for an etching duration of about 5 seconds to about 10 seconds.

The top surface of the remainder fin 201 may be used as an etch stop surface. When the top surface of the fin 201 is exposed, the wet etching process may be stopped. During the wet etching process, the surface of the semiconductor nitride layer 207 may be in sufficient contact with the etching solution. The sidewall spacer 215 may not affect the contacting ability of the etching solution with the semiconductor nitride layer 207 located on the top surface of fin 201, so that, in the wet etching process, a uniform etch rate may be provided for the semiconductor nitride layer 207 located on the top surface of fin 201. Because of the protective effect of the sidewall spacer 215, the semiconductor nitride layer 207 on the top surface of the fin 201 may only be etched in a top-down direction, until the top surface of fin 201 is exposed. In addition, after removal of the semiconductor nitride layer 207, the exposed remainder fin 201 may have a flat top surface.

In this manner, in one embodiment, the top surface of the remainder fin 201 may be flat to provide the opening 208 with desirable bottom topography to facilitate the stress layer with high quality to be subsequently formed on the top surface of the remainder fin 201.

Further, since the sidewall spacer 215 may not be nitrided during the selective nitriding process, the subsequent wet etching process may not etch non-nitrided sidewall spacer 215. The non-nitrided sidewall spacer 215 can then protect the remainder fin 201 to prevent sidewalls of the remainder fin 201 from being exposed.

In other embodiments, as shown in FIG. 13, the sidewall spacer 215 is merely located on sidewall surface of fin 201 and on surface portions of the insulation layer 202, other surface portions of the insulation layer 202 are exposed to the wet etching environment. However, because the insulation layer 202 may not be nitrided during the selective nitriding process, the subsequent nitride-specific wet etching process may not etch the non-nitrided insulation layer 202. The non-nitrided insulation layer 202 may remain unchanged and the wet etching process may not etch the insulation layer 202. The insulation layer 202 may thus provide desired electrical isolation.

In one embodiment, the selective nitriding process may be performed for one time or may be repeated for a number of times. For example, after each selective nitriding process is performed, a wet etching process may be used to remove the semiconductor nitride layer, until the openings formed by adjacent sidewall spacers and the remainder fin reach a predetermined target value of depth.

Still in FIG. 13, the sidewall spacer 215 is merely located on sidewall surface of fin 201 and on surface portions of the insulation layer 202, the insulation layer 202 may be formed by an etch back process, which may form V-shaped groove in the top surface of the fin 201. Due to a uniform etch rate of semiconductor nitride layer 207 in the wet etching process, the V-shaped groove in the top surface of the fin 201 may not be further enhanced and may be controlled in an acceptable range for subsequently forming the stress layer. In particular, in the repeated selective nitriding processes for forming the semiconductor nitride layer 207 and then removing the semiconductor nitride layer 207, the size of the V-shaped groove in the top surface of the fin 201 may gradually become smaller, and may further flatten the top surface of the remainder fin 201.

Figure 15:
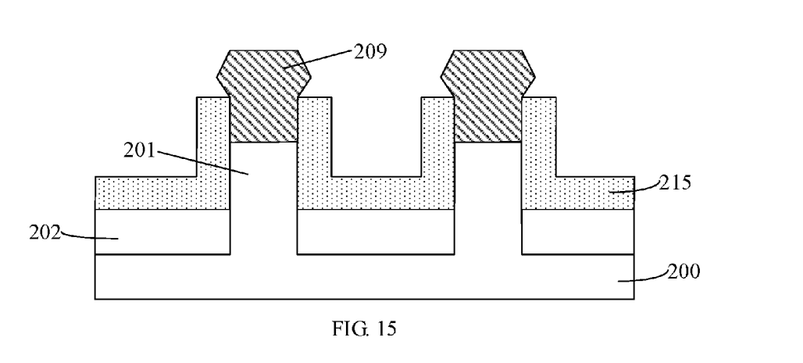

Referring to FIG. 15, a stress layer 209 is formed to fill in the opening 208.

In one embodiment, when the to-be-formed FinFET is a PMOS device, the stress layer 209 may be made of SiGe or SiGeB. The stress layer 209 may exert a compressive stress on the channel region in the remainder fin 201 under the gate structure to thereby enhance hole mobility in the channel region and to improve the performance of P-type FinFET.

In another embodiment, when the to-be-formed FinFET is an NMOS device, the stress layer 209 may be made of SiC or SiCP. The stress layer 209 may exert a tensile stress on the channel region in the remainder fin 201 under the gate structure to thereby enhance electron mobility in the channel region and to improve the performance of N-type FinFET.

A selective epitaxial process may be used to form the stress layer 209 on the top surface of the fin 201. In one embodiment, when the stress layer 209 is made of SiGe, for example, the selective epitaxy process may be performed at a reaction temperature of about 600° C. to about 1100° C. under a pressure of about 1 Torr to about 500 Torr, using a silicon source gas containing $SiH_4$ or $SiH_2Cl_2$, a germanium source gas containing $GeH_4$, and other gases including HCl gas and $H_2$. Each of the silicon source gas, the germanium source gas, and the HCl gas has a flow rate of about 1 sccm to about 1000 sccm. The $H_2$ flow is about 0.1 slm to about 50 slm.

The epitaxial SiGe growth may be different in different directions. The resultant stress layer 209 may thus have a cross-sectional shape approximately pentagonal. Because the opening 208 has desired bottom topography, the stress layer 209 formed therein may have high quality in deposition.

In conventional methods, the opening at the bottom surface may have a large V-shaped groove, resulting in poor quality of the formed stress layer.

After forming the stress layer 209, the stress layer 209 may be doped by ion implantation. In one embodiment, the dopant ions are P-type ions, such as B, Ga or In. In other embodiments of the present disclosure, an in-situ doping process may be performed when forming the stress layer 209 by introducing a doping gas during the epitaxial process to in-situ form the stress layer 209 with dopant ions.

In other embodiments of the present disclosure, the stress layer may be made of SiC. The stress layer may include N type dopant ions, such as P, As, or Sb.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming FinFET, comprising: forming discrete fins on a substrate;
    forming an insulation layer on the substrate between the discrete fins, the insulation layer having a top surface lower than a top surface of the fin and covering a portion of a sidewall surface of the fin;
    forming a sidewall spacer covering the sidewall surface of the fin and exposing the top surface of the fin;
    selectively nitriding a top portion of the fin to convert a thickness portion of the fin into a semiconductor nitride nitrided layer on a remainder fin;
    removing the semiconductor nitride nitrided layer to form an opening on the remainder fin and between adjacent sidewall spacers; and forming a stress layer to fill the opening.

2. The method according to claim 1, further comprising: selecting materials used for forming the fin and the insulation layer, such that the fin is selectively nitrided having a nitriding rate greater than a nitriding rate of the insulation layer.

3. The method according to claim 1, wherein the step of selectively nitriding a top portion of the fin is performed using a nitrogen-containing plasma.

4. The method according to claim 1, wherein the step of removing the semiconductor nitride nitrided layer uses a wet etching process, the wet etching process including an etching liquid including a phosphoric acid-based solution at a temperature of about 120° C. to about 180° C., for an etching duration of about 5 seconds to about 10 seconds.

5. The method according to claim 1, further comprising: increasing a depth of the opening by repeating a process including: selectively nitriding a top portion of the remainder fin to convert a thickness portion of the remainder fin into a semiconductor nitride nitrided layer, and removing the semiconductor nitride nitrided layer.

6. The method according to claim 1, wherein the sidewall spacer is formed on the sidewall surface of the fin and covering a surface portion of the insulation layer.

7. The method according to claim 1, wherein the sidewall spacer is formed by:
    forming a sidewall layer covering a surface of the insulation layer, and covering the top surface and the sidewall surface of the fin, and
    using a mask-less etching process to etch back to remove a portion of the sidewall layer that is on the top surface of the fin and on another surface portion of the insulation layer to form the sidewall spacer covering the sidewall surface of the fin and covering the surface portion of the insulation layer.

8. The method according to claim 1, further comprising: prior to forming the sidewall spacer, forming a gate structure across a length portion of the fin and on the insulation layer.

9. The method according to claim 2, wherein, when selectively nitriding the top portion of the fin, the insulation layer is un-nitrided.

10. The method according to claim 2, wherein the fin is made of a material including silicon and the insulation layer is made of a material including silicon oxide.

11. The method according to claim 10, wherein the semiconductor nitride nitrided layer is made of a material including silicon nitride, and the sidewall spacer is made of a material including silicon oxide or silicon oxynitride.

12. The method according to claim 10, wherein the step of selectively nitriding a top portion of the fin is performed under a pressure of about 0.1 Torr to about 20 Torr.

13. The method according to claim 10, further comprising using a microwave method or an inductive coupling method to form nitrogen-containing plasma.

14. The method according to claim 13, wherein the nitrogen-containing plasma is formed to provide energy greater than Si—Si bond energy and less than Si—O bond energy.

15. The method according to claim 13, wherein the step of selectively nitriding the top portion of the fin using the microwave method uses a reaction gas including N2 having a N2 flow rate of about 50 sccm to about 500 sccm at a chamber
temperature of about 300° C. to about 500° C., under a chamber pressure of about 1 Torr to about 10 Torr, with a source power of about 1000 watts or less.

16. The method according to claim 3, further comprising: plasmatizing a nitrogen-containing gas to form the nitrogen-containing plasma,
the nitrogen-containing gas includes a combination of N2 and Ar, a combination of N2 and He, or N2.

17. The method according to claim 6, wherein the sidewall spacer is formed by:
forming a sidewall layer covering the insulation layer, and the top surface and the sidewall surface of the fin,
forming an organic material film on the sidewall layer, the organic material film having a top surface higher than a top surface of the sidewall layer,
polishing to remove a portion of the organic material film and the sidewall layer that are above the top surface of the fin to form a sidewall spacer covering the sidewall surface of the fin and covering a surface of the insulation layer and to form an organic material layer on the sidewall spacer, the organic material layer having a top surface coplanar with the top surface of the fin, and removing the organic material layer.

18. A semiconductor device, comprising: discrete fins on a substrate;
an insulation layer on the substrate between the discrete fins, the insulation layer having a top surface lower than a top surface of the fin and covering a portion of a sidewall surface of the fin;
a sidewall spacer covering the sidewall surface of the fin and having a top surface higher than the top surface of the fin; and
a stress layer on the top surface of the fin and between the sidewall spacers, wherein the stress layer is formed by: selectively nitriding a top portion of the fin to convert a thickness portion of the fin into a semiconductor nitride nitrided layer on a remainder fin, removing the semiconductor nitride nitrided layer to form an opening on the remainder fin and between adjacent sidewall spacers; and forming tine stress layer to fill the opening, wherein the stress layer is epitaxially formed and is made of a material including SiGe, SiGeB, SiC, or SiCP.

19. The semiconductor device according to claim 18, wherein:
the fin and the insulation layer are made of materials such that, when the fin is nitiried, the insulation layer is un-nitrided.

20. The semiconductor device according to claim 18, wherein: the nitrided layer is made of a material including silicon nitride, and
the sidewall spacer is made of a material including silicon oxide or silicon oxynitride.

* * * * *